US006985039B2

(12) United States Patent
Bar-David et al.

(10) Patent No.: US 6,985,039 B2
(45) Date of Patent: Jan. 10, 2006

(54) METHOD AND APPARATUS FOR PROVIDING A STABLE POWER OUTPUT OF POWER AMPLIFIERS, OPERATING UNDER UNSTABLE SUPPLY VOLTAGE CONDITIONS

(75) Inventors: Israel Bar-David, Haifa (IL); Avner Elia, Ramat Ishai (IL); Alexander Veinblat, Haifa (IL)

(73) Assignee: Paragon Communications Ltd., (IL)

( * ) Notice: Subject to any disclaimer, the term of this patent is extended or adjusted under 35 U.S.C. 154(b) by 18 days.

(21) Appl. No.: 10/829,857

(22) Filed: Apr. 21, 2004

(65) Prior Publication Data

US 2004/0251968 A1    Dec. 16, 2004

(30) Foreign Application Priority Data

Apr. 25, 2003    (IL)    ..................................... 155581

(51) Int. Cl.
*H03F 3/04*    (2006.01)
(52) U.S. Cl. ....................... 330/297; 330/135; 330/136
(58) Field of Classification Search ................ 330/297, 330/270, 136, 135, 129, 123

See application file for complete search history.

(56) References Cited

U.S. PATENT DOCUMENTS

| | | | | |
|---|---|---|---|---|
| 5,883,506 A | * | 3/1999 | Masato | ........................ 323/297 |
| 6,177,786 B1 | * | 1/2001 | Shimamori | .................. 323/283 |
| 6,775,160 B2 | * | 8/2004 | Siri | .............................. 363/89 |
| 2002/0028700 A1 | * | 3/2002 | Kato | ........................... 455/572 |

* cited by examiner

*Primary Examiner*—John B Nguyen
(74) *Attorney, Agent, or Firm*—Baker Botts LLP

(57) ABSTRACT

Method and circuit for stabilizing the output power of a power amplifier, operated with signals having a large peak-to-average ratio and fed by a DC power supply with fluctuating output voltage. An allowable fluctuating range for the voltage output from the DC power supply and a constant voltage level are determined. A controllable voltage enhancement circuitry that can output an enhancement voltage is provided. The input of the voltage enhancement circuitry and a first DC supply path are connected to the output of the DC power supply. The output of the voltage enhancement circuitry is connected to a second DC supply path. While the instantaneous value of the fluctuating output voltage is lower than the constant voltage level, the voltage enhancement circuitry generates an enhancement voltage that causes the sum of the voltages supplied through the first and the second supply paths, to be identical to the constant voltage level.

6 Claims, 2 Drawing Sheets

US 6,985,039 B2

METHOD AND APPARATUS FOR PROVIDING A STABLE POWER OUTPUT OF POWER AMPLIFIERS, OPERATING UNDER UNSTABLE SUPPLY VOLTAGE CONDITIONS

FIELD OF THE INVENTION

This application claims priority from Israeli Patent Application No. 155581 filed on Apr. 25, 2003, which is incorporated herein by reference. The present invention relates to the field of power amplifiers. More particularly, the invention relates to a method and apparatus for providing a stable power output to power amplifiers, operated with signals having a large peak-to-average ratio under unstable supply voltage conditions, while eliminating the need for DC input voltage stabilization.

BACKGROUND OF THE INVENTION

Modem communication systems, such as cellular systems, employ power amplifiers in their basestations, in order to communicate with subscribers that are distributed in cells. These power amplifiers are required to amplify Radio Frequency (RF) signals, such as signals used in communication systems that are required to transmit multiple signals, simultaneously. Multiple signals should be transmitted, for example, due to multiple users sharing the same frequency band, such as cellular systems that are operated in Code Division Multiple Access (CDMA) regimes. A basic condition for the proper operation of such power amplifiers is a stable feeding DC voltage, under any predetermined range of input RF signals and load.

A major problem that frequently occurs in basestation is the fluctuations in the feeding DC voltage, caused by inadequate battery charging and by load variations. This problem is apparent from practical requirements, which often define a range of supply voltage, for example, between 21 to 31 volts.

Conventional approaches for fulfilling such requirements employ high power built-in DC/DC converters which are bulky, expensive and power consuming. Such high power built-in DC/DC converters reduce the overall efficiency of the power amplifiers by 15% (typically). Therefore, this problem should be overcome by using a more efficient solution.

The approaches described above have not yet provided satisfactory solution to the problem of providing a stable power output to power amplifiers, operated with signals having a large peak-to-average ratio under unstable supply voltage conditions, while eliminating the need for DC input voltage stabilization.

It is an object of the present invention to provide a method and apparatus for providing a power amplifier having a stable power output, while operating under unstable DC supply voltage conditions.

It is another object of the present invention to provide a method and apparatus for providing a power amplifier having a stable power output while operating under unstable DC supply voltage conditions, with improved efficiency.

It is still another object of the present invention to provide a method and apparatus for providing a power amplifier having a stable power output while operating under unstable DC supply voltage conditions, which is compact and cost effective.

It is yet another object of the present invention to provide a method and apparatus for providing a power amplifier that can output a non-distorted RF signal of given power, independently of fluctuations and/or variations in the voltage of the DC power supply, within a predetermined allowable range.

Other objects and advantages of the invention will become apparent as the description proceeds.

SUMMARY OF THE INVENTION

The present invention is directed to a method for stabilizing the output power of a power amplifier, operated with signals having a large peak-to-average ratio and fed by a DC power supply having fluctuating output voltage, the power amplifier having a first DC supply path for constantly providing DC power to the power amplifier and a second supply path for providing enhancement supply voltage to the power amplifier, to be exploited during the peak period of the signals. An allowable fluctuating range that is varying between an upper limit (U) and a lower limit (L) is determined for the voltage that is output from the DC power supply. A constant voltage level ($B_{max}$) being equal or greater than the upper limit (U) is also determined. A controllable voltage enhancement circuitry being capable of outputting an enhancement voltage generated from the fluctuating output voltage is provided. The enhancement voltage varies between a first non-negative value ($B_{max}-U$) being the difference between the constant voltage level and the upper limit, and a second positive value ($B_{max}-L$) being the difference between the constant voltage level and the lower limit, according to the control input of the voltage enhancement circuitry. The input of the voltage enhancement circuitry and the first DC supply path are connected to the output of the DC power supply, while the output of the voltage enhancement circuitry is connected to the second DC supply path. The instantaneous magnitude of the fluctuating output voltage and the enhancement voltage are continuously sampled. As long as the instantaneous value of the fluctuating output voltage is lower than the constant voltage level ($B_{max}$), the voltage enhancement circuitry generates an enhancement voltage that causes the sum of the voltages supplied through the first and second supply paths, to be identical to the constant voltage level ($B_{max}$).

By using the term "stabilizing the output power" it is meant to include any operation of providing a level of enhancement, to a power amplifier fed by unstable supply voltage, that is sufficient to keep the output power at any time point during the peak time, at the same value as the power amplifier outputs when fed by the constant supply voltage, which is not lower than the highest magnitude of the fluctuating voltage that is output by the unstable power supply.

Preferably, enhancement voltage is generated by determining a reference voltage, from which the enhancement voltage is derived and obtaining two control signals by amplifying the sampled instantaneous magnitude of the fluctuating output voltage and the enhancement voltage by the ratio between the reference voltage and the constant voltage level. The sum of the control signals is fed into the control input of the voltage enhancement circuitry, thereby causing the voltage enhancement circuitry to continuously amplify the reference voltage to a magnitude being the difference ($B_{max}-B_i$) between the constant voltage level and the instantaneous value of the fluctuating output voltage.

The amplification of the reference voltage may be performed by inputting the sum of the control signals into the control input of a low power adjustable DC/DC converter, while the fluctuating output voltage is fed into the input of the DC/DC converter and the enhancement voltage is obtained from the output of the DC/DC converter.

The present invention is also directed to an apparatus for stabilizing the output power of a power amplifier, operated with signals having a large peak-to-average ratio and fed by a DC power supply having fluctuating output voltage, the power amplifier having a first DC supply path for constantly providing DC power to the power amplifier and a second supply path for providing enhancement supply voltage to the power amplifier, to be exploited during the peak period of the signals. The apparatus comprises:

a) controllable voltage enhancement circuitry having an input connected to the output of the DC power supply and an output connected to the second DC supply path, the voltage enhancement circuitry being capable of outputting an enhancement voltage generated from the fluctuating output voltage, the enhancement voltage varying between a first non-negative value ($B_{max}-U$) being the difference between a predetermined constant voltage level ($B_{max}$) being equal or greater than the upper limit (U), and a second positive value ($B_{max}-L$) being the difference between the constant voltage level and the lower limit, according to the control input of the voltage enhancement circuitry;

b) circuitry for continuously sampling the instantaneous magnitude of the fluctuating output voltage and the enhancement voltage; and c) circuitry for generating, as long as the instantaneous value of the fluctuating output voltage is lower than the constant voltage level ($B_{max}$), an enhancement voltage that causes the sum of the voltages supplied through the first and second supply paths, to be identical to the constant voltage level ($B_{max}$).

The apparatus may comprise:

a) an adjustable low power DC/DC converter having a predetermined reference voltage from which the enhancement voltage is derived according to the level of a control voltage being input to its control input, the input of which being connected to the output of the DC power supply and the output of which being connected to the second DC supply path, the DC/DC converter being capable of outputting the enhancement voltage, generated from the fluctuating output voltage;

b) a voltage adder having at least two inputs and an output that is connected to the control input;

c) a first amplifier having an input connected to the input of the DC/DC converter and to the output of the DC power supply, and an output connected to one input of the voltage adder, for amplifying the sampled instantaneous magnitude of the fluctuating output voltage by a gain being essentially the ratio between the reference voltage and the constant voltage level; and d) a second amplifier having an input connected to the output of the DC/DC converter and an output connected to another input of the voltage adder, for amplifying the enhancement voltage by a gain being essentially the ratio between the reference voltage and the constant voltage level.

The present invention is further directed to a power amplifier operated with signals having a large peak-to-average ratio, having a first DC supply path for constantly providing DC power to the power amplifier from a DC power supply having fluctuating output voltage, and a second supply path for providing enhancement supply voltage to the power amplifier, to be exploited during the peak period of the signals, that further comprises:

a) a controllable voltage enhancement circuitry having an input connected to the output of the DC power supply and an output connected to the second DC supply path, the voltage enhancement circuitry being capable of outputting an enhancement voltage generated from the fluctuating output voltage, the enhancement voltage varying between a first non-negative value ($B_{max}-U$) being the difference between a predetermined constant voltage level ($B_{max}$) being equal or greater than the upper limit (U), and a second positive value ($B_{max}-L$) being the difference between the constant voltage level and the lower limit, according to the control input of the voltage enhancement circuitry;

b) circuitry for continuously sampling the instantaneous magnitude of the fluctuating output voltage and the enhancement voltage; and c) circuitry for generating, as long as the instantaneous value of the fluctuating output voltage is lower than the constant voltage level ($B_{max}$), an enhancement voltage that causes the sum of the voltages supplied through the first and second supply paths, to be identical to the constant voltage level ($B_{max}$).

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
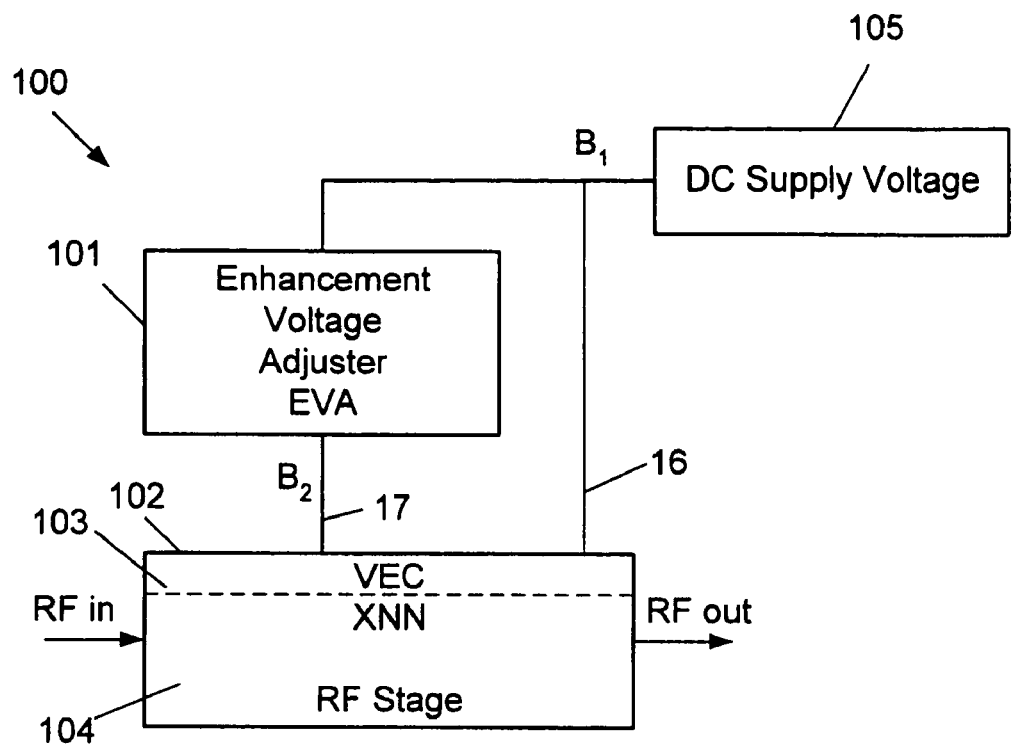
FIG. 1 is a block diagram of the basic circuit for stabilizing the output power of a power amplifier operated with signals having a large peak-to-average ratio, according to a preferred embodiment of the invention.
Figure 2:
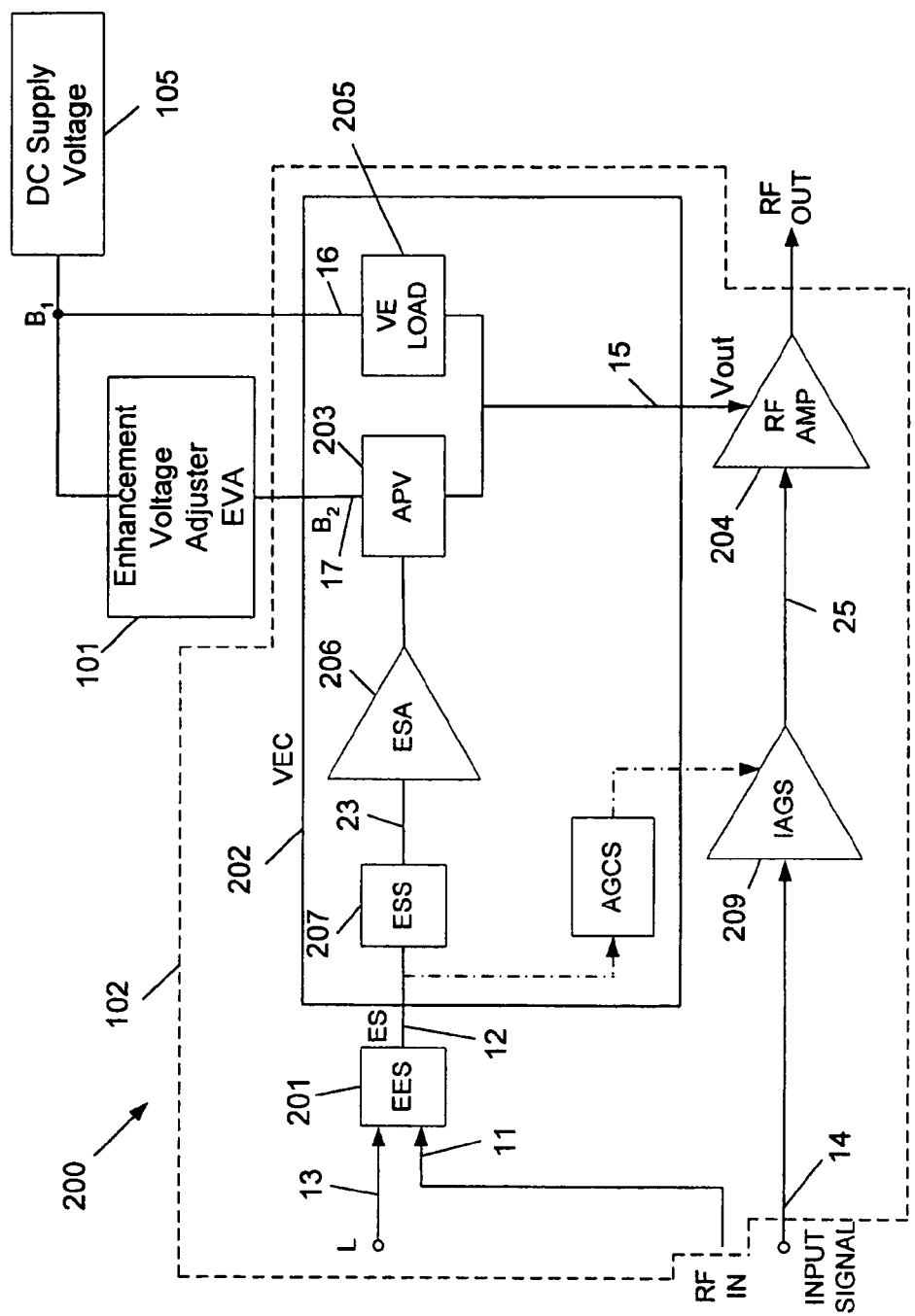
FIG. 2 is a block diagram of a power amplifier operated with signals having a large peak-to-average ratio having an embedded circuitry for stabilizing its output power during the peak time, according to a preferred embodiment of the invention.

FIG. 1 is a block diagram of the basic circuit for stabilizing the output power of a power amplifier operated with signals having a large peak-to-average ratio, according to a preferred embodiment of the invention. The circuit 100 comprises an Enhancement Voltage Adjuster (EVA) 101 and an XNN power amplifier 102, consisting of an embedded Voltage Enhancement Circuitry (VEC) 103 and an RF stage 104. The structure of XNN power amplifier 102, as well as it mode of operation during the time periods when the input signal exceeds a predetermined threshold (hereinafter called the "peak time"), are described in details in WO 01/67598 (FIG. 2A). Basically, XNN power amplifier 102 comprises two paths for feeding DC voltages. A first DC supply path 16 for constantly providing DC power, a second supply path 17 for providing enhancement supply voltage, exploited during the peak time. These supply paths are shown also in FIG. 2.

Circuit 100 is fed from a DC power supply 105, the supply voltage of which may fluctuate, for example, within a range of ±25% from its nominal value, or within another allowable range having a lower and upper limit. Power supply 105 feeds both the EVA 101 and the XNN power amplifier 102 with the instantaneous fluctuating DC input voltage $B_1$. EVA 101 generates a DC input voltage $B_2$, required for the enhancement path of VEC 103. Actually, EVA 101 generates a varying enhancement voltage $B_2$, which is continuously supplied to the XNN power amplifier 102, to be exploited during the peak time, such that the sum of the voltages supplied to the RF stage 104 via both DC supply paths 16 and 17 remains constant at a predetermined level $B_{max}$ (which is not lower than the highest fluctuating voltage that is output DC power supply 105), regardless any fluctuations in the instantaneous value of $B_1$. This implies that at any time point $$B_2 = B_{max} - B_1 \qquad [\text{Eq. 1}]$$

FIG. 2 is a block diagram of a power amplifier operated with signals having a large peak-to-average ratio having an embedded circuitry for stabilizing its output power during the peak time, according to a preferred embodiment of the invention. This figure illustrates the connection of the EVA 101 and the DC power supply 105 to the XNN power amplifier 102 described in WO 01/67598. During the peak time, the APV 203 becomes conductive and allows the EVA 101 to apply the enhancement voltage $B_2$ to the enhancement path 17, so as to emulate a condition, during which the DC power supply 105 outputs a stable DC voltage $B_{max}$.

Figure 3:
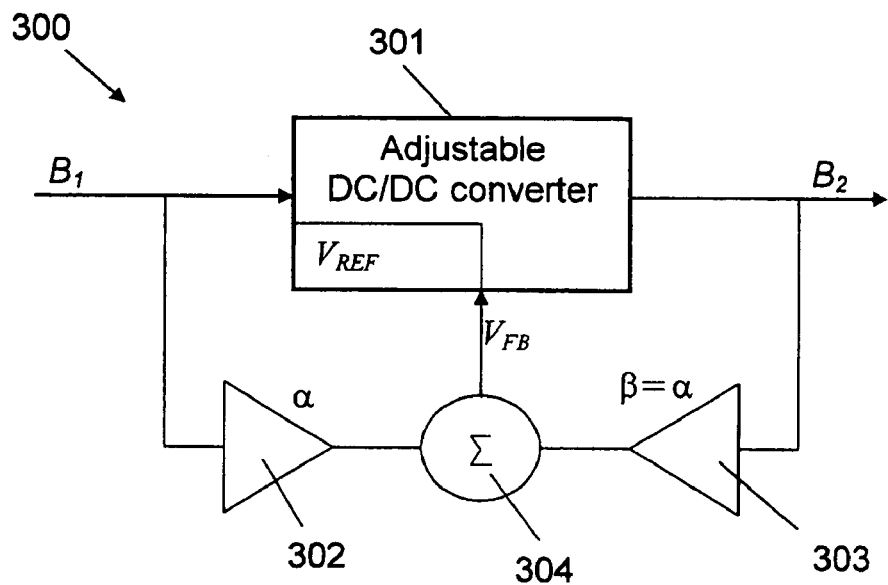
FIG. 3 is a block diagram of an exemplary circuit for implementing the Enhancement Voltage Adjuster, according to a preferred embodiment of the invention.

FIG. 3 is a block diagram of an exemplary circuit for implementing the Enhancement Voltage Adjuster, according to a preferred embodiment of the invention. The circuit 300 employs a low power adjustable DC/DC converter 301, which is a low cost, off the shelf product. Adjustable DC/DC converter 301 may be a converter with relatively low required power handling capability, due to the fact that is provides only the enhancement voltage, and only during the peak time (i.e., the average power dissipation of such converter is low). Adjustable DC/DC converter 301 generates the desired enhancement voltage $B_2$ from the input voltage $B_1$. Adjustable DC/DC converter 301 comprises an inherent fixed reference voltage $V_{ref}$, which is used to generate the enhancement voltage $B_2$, according to the instantaneous value of a feedback voltage $V_{fb}$, which is also input into Adjustable DC/DC converter 301. $V_{fb}$ is generated by sampling the voltages $B_1$ and $B_2$, amplifying them by factors $\alpha$ and $\beta$, respectively, using amplifiers 302 and 303, and by adding the amplified voltages using a voltage adder 304, such that $$V_{FB} = \beta B_1 + \alpha B_2 \qquad [\text{Eq. 2}]$$

Assuming that A is the open loop gain of the internal control circuit of the DC/DC converter 301, the output voltage is given by $$B_2 = (V_{REF} - V_{FB})A \qquad [\text{Eq. 3}]$$

Therefore, $$B_2 = AV_{REF} - A\beta B_1 - A\alpha B_2 \qquad [\text{Eq. 4}]$$

and $$B_2 = \frac{AV_{REF} - A\beta B_1}{1 + \alpha A} \qquad [\text{Eq. 5}]$$

$$= \frac{A}{1+\alpha A} V_{REF} - \frac{A\beta}{1+\alpha A} B_1$$

Assuming that A is large $$\frac{A}{1+\alpha A} \to \frac{1}{\alpha} \qquad [\text{Eq. 6}]$$

$$\frac{A\beta}{1+\alpha A} \to \frac{\beta}{\alpha} \qquad [\text{Eq. 7}]$$

Therefore $$B_2 = \frac{1}{\alpha} V_{REF} - \frac{\beta}{\alpha} B_1 \qquad [\text{Eq. 8}]$$

If $\alpha$ and $\beta$ are selected such that $\alpha = \beta$, and $B_{max}$ is selected such that $$B_{max} = \frac{1}{\alpha} V_{ref} \qquad [\text{Eq. 9}]$$

The desired output voltage $B_2$ is $$B_2 = B_{max} - B_1$$

which fulfills the condition of Eq. 1 above.

Amplifiers 302 and 303 and the voltage adder 304 may be implemented using low cost, off the shelf operational amplifiers.

Of course, the value of $B_{max}$ can be selected to be identical to the upper limit or higher than the upper limit. For example, if the nominal value of $B_1$ is +28V and the allowable fluctuating range is between +22 v and +30V, $B_{max}$ can be selected to be +30V. In this case the enhancement voltage $B_2$ will vary between zero (when $B_1$=+30V) and 8V (when $B_1$=+22V).

On the other hand, if $B_{max}$ is selected to be +32V, the enhancement voltage $B_2$ will vary between +2V (when $B_1$=+30V) and +10V (when $B_1$=+22V).

The following example illustrates the advantage of using the EVA 101, described hereinabove. Widespread RF high power amplifiers employ power transistors, such as the Motorola MRF series, with nominal operating voltage of 28 volts. However, they are capable operating at up to 32V. The 85 W model (which in a practical balanced configuration) would yield average power of 30 W, when operated at the nominal 28V, as indicated by its specification.

A judicious design that employs a power amplifier XNN 102 with a peak enhancement that reaches 32V can achieve an increase in its output power by the square of the voltage ratio, i.e., a total power of $30(32/28)^2 = 39$ W, which is a 30% increase. Efficiency will be increased by a factor of $32/28 = 1.14$, when operating at a DC supply voltage of 28V, and by $$\frac{32}{22} = 1.45$$

when the DC supply voltage drops to 22V.

It is recalled that XNN operation enhances the voltage applied to the power transistors, when the instantaneous signal envelope increases above a predetermined threshold, $\theta$. In this example, if the supply voltage, at which the envelope peaks of an RF signal having 30 W average power can be accommodated, is actually the nominal one, 28V, the threshold $\theta_{28}$ can be set at the level corresponding to 30 W times the peak-to-average ratio (typically 10), that is to 300 W.

If the DC supply voltage drops, for example, to 22V, then a power amplifier without enhancement can handle only $30(22/28)^2=18.5$ W. Then, the threshold $\theta_{22}$ should be set to a level corresponding to 10 times this value, that is to 185 W. Since voltages increase as the square root of power, the ratio of $\theta_{28}$ to $\theta_{22}$ is $\sqrt{300/185}=1.27$. Such a change in the threshold that controls the advent of the envelope enhancement can be easily adaptively adjusted.

Of course, the enhancement of the voltage in the latter case has to be from 22 to 32V compared to only from 28 to 32V in the case of the nominal voltage specified hereinabove. This change is, however, inherently effectuated by the proportionality between the voltage enhancement and the excess envelope voltage of the enhancement concept of XNN 102, as ensured by the associated circuitry 101.

XNN 102 operating in this mode will increase the power output by 30% (comparing to a conventional amplifier working at 28V), while maintaining this level within the entire supply voltage range of 22V to 32V. The overall efficiency will be increased by 14% to 45%.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A method for stabilizing the output power of a power amplifier, operated with signals having a large peak-to-average ratio and fed by a DC power supply having fluctuating output voltage, said power amplifier having a first DC supply path for constantly providing DC power to said power amplifier and a second supply path for providing enhancement supply voltage to said power amplifier, to be exploited during the peak period of said signals, comprising:
   a) determining an allowable fluctuating range for the voltage that is output from said DC power supply, varying between an upper limit (U) and a lower limit (L);
   b) determining a constant voltage level ($B_{max}$) being equal or greater than said upper limit (U);
   c) providing a controllable voltage enhancement circuitry being capable of outputting an enhancement voltage generated from said fluctuating output voltage, said enhancement voltage varying between a first non-negative value ($B_{max}-U$) being the difference between said constant voltage level and said upper limit, and a second positive value ($B_{max}-L$) being the difference between said constant voltage level and said lower limit, according to the control input of said voltage enhancement circuitry;
   d) connecting the input of said voltage enhancement circuitry and said first DC supply path to the output of said DC power supply;
   e) connecting the output of said voltage enhancement circuitry to said second DC supply path;
   f) continuously sampling the instantaneous magnitude of said fluctuating output voltage and said enhancement voltage; and
   g) as long as the instantaneous value of said fluctuating output voltage is lower than said constant voltage level ($B_{max}$), causing said voltage enhancement circuitry to generate an enhancement voltage that causes the sum of the voltages supplied through said first and second supply paths, to be identical to said constant voltage level ($B_{max}$).

2. A method according to claim 1, wherein enhancement voltage is generated by performing the following steps:
   a) determining a reference voltage, from which said enhancement voltage is derived;
   b) obtaining two control signals by amplifying the sampled instantaneous magnitude of the fluctuating output voltage and the enhancement voltage by the ratio between said reference voltage and the constant voltage level; and
   c) feeding the sum of said control signals into the control input of the voltage enhancement circuitry, thereby causing said voltage enhancement circuitry to continuously amplify said reference voltage to a magnitude being the difference ($B_{max}-B_1$) between said constant voltage level and the instantaneous value of the fluctuating output voltage.

3. A method according to claim 2, wherein the amplification of the reference voltage is performed by inputting the sum of the control signals into the control input of a low power adjustable DC/DC converter, while the fluctuating output voltage is fed into the input of said DC/DC converter and the enhancement voltage is obtained from the output of said DC/DC converter.

4. Apparatus for stabilizing the output power of a power amplifier, operated with signals having a large peak-to-average ratio and fed by a DC power supply having fluctuating output voltage, said power amplifier having a first DC supply path for constantly providing DC power to said power amplifier and a second supply path for providing enhancement supply voltage to said power amplifier, to be exploited during the peak period of said signals, comprising:
   a) a controllable voltage enhancement circuitry having an input connected to the output of said DC power supply and an output connected to said second DC supply path, said voltage enhancement circuitry being capable of outputting an enhancement voltage generated from said fluctuating output voltage, said enhancement voltage varying between a first non-negative value ($B_{max}-U$) being the difference between a predetermined constant voltage level ($B_{max}$) being equal or greater than said upper limit (U), and a second positive value ($B_{max}-L$) being the difference between said constant voltage level and said lower limit, according to the control input of said voltage enhancement circuitry;
   b) circuitry for continuously sampling the instantaneous magnitude of said fluctuating output voltage and said enhancement voltage; and
   c) circuitry for generating, as long as the instantaneous value of said fluctuating output voltage is lower than said constant voltage level ($B_{max}$), an enhancement voltage that causes the sum of the voltages supplied through said first and second supply paths, to be identical to said constant voltage level ($B_{max}$).

5. Apparatus according to claim 4, comprising:
   a) an adjustable low power DC/DC converter having a predetermined reference voltage from which the enhancement voltage is derived according to the level of a control voltage being input to its control input, the input of which being connected to the output of the DC power supply and the output of which being connected to the second DC supply path, said DC/DC converter being capable of outputting said enhancement voltage, generated from the fluctuating output voltage;

b) a voltage adder having at least two inputs and an output that is connected to said control input;

c) a first amplifier having an input connected to the input of said DC/DC converter and to the output of said DC power supply, and an output connected to one input of said voltage adder, for amplifying the sampled instantaneous magnitude of the fluctuating output voltage by a gain being essentially the ratio between the reference voltage and the constant voltage level; and d) a second amplifier having an input connected to the output of said DC/DC converter and an output connected to another input of said voltage adder, for amplifying the enhancement voltage by a gain being essentially the ratio between the reference voltage and the constant voltage level.

6. A power amplifier operated with signals having a large peak-to-average ratio, having a first DC supply path for constantly providing DC power to said power amplifier from a DC power supply having fluctuating output voltage, and a second supply path for providing enhancement supply voltage to said power amplifier, to be exploited during the peak period of said signals, further comprising:

a) a controllable voltage enhancement circuitry having an input connected to the output of said DC power supply and an output connected to said second DC supply path, said voltage enhancement circuitry being capable of outputting an enhancement voltage generated from said fluctuating output voltage, said enhancement voltage varying between a first non-negative value ($B_{max}-U$) being the difference between a predetermined constant voltage level ($B_{max}$) being equal or greater than said upper limit (U), and a second positive value ($B_{max}-L$) being the difference between said constant voltage level and said lower limit, according to the control input of said voltage enhancement circuitry;

b) circuitry for continuously sampling the instantaneous magnitude of said fluctuating output voltage and said enhancement voltage; and c) circuitry for generating, as long as the instantaneous value of said fluctuating output voltage is lower than said constant voltage level ($B_{max}$), an enhancement voltage that causes the sum of the voltages supplied through said first and second supply paths, to be identical to said constant voltage level ($B_{max}$).

* * * * *